(12) United States Patent
Schumacher et al.

(10) Patent No.: US 6,767,377 B2
(45) Date of Patent: Jul. 27, 2004

(54) AQUEOUS DISPERSION CONTAINING CERIUM OXIDE-COATED SILICON POWDER, PROCESS FOR THE PRODUCTION THEREOF AND USE THEREOF

(75) Inventors: Kai Schumacher, Hofheim (DE); Helmut Mangold, Rodenbach (DE); Juergen Meyer, Stockstadt (DE); Wolfgang Lortz, Waechtersbach (DE); Christoph Batz-Sohn, Hanau-Mittelbuchen (DE)

(73) Assignee: Degussa AG, Duesseldorf (DE)

( * ) Notice: Subject to any disclaimer, the term of this patent is extended or adjusted under 35 U.S.C. 154(b) by 0 days.

(21) Appl. No.: 10/358,323

(22) Filed: Feb. 5, 2003

(65) Prior Publication Data
US 2003/0215639 A1 Nov. 20, 2003

(30) Foreign Application Priority Data

Feb. 5, 2002 (DE) ......................................... 102 04 471

(51) Int. Cl.$^7$ ........................... C09G 1/02; C09G 1/04; H01L 21/02; H01L 21/302; B32B 1/00

(52) U.S. Cl. ............................. 51/308; 106/3; 428/404; 438/692; 438/693

(58) Field of Search ............................... 51/308; 106/3; 428/404; 438/692, 693; 216/89

(56) References Cited

U.S. PATENT DOCUMENTS 6,328,944 B1 * 12/2001 Mangold et al. ............ 423/278
6,645,265 B1 * 11/2003 Wang .......................... 51/308
6,663,683 B2 * 12/2003 Lortz et al. .................... 51/308
6,676,719 B2 * 1/2004 Lortz et al. .................... 51/308

* cited by examiner

Primary Examiner—Michael A. Marcheschi
(74) Attorney, Agent, or Firm—Oblon, Spivak, McClelland, Maier & Neustadt, P.C.

(57) ABSTRACT

The present invention relates to an aqueous dispersion containing a silicon dioxide powder coated with cerium oxide. In addition, the present invention provides a method of producing an aqueous dispersion containing a silicon dioxide powder coated with cerium oxide and methods of using this aqueous dispersion for chemical-mechanical polishing.

18 Claims, No Drawings

AQUEOUS DISPERSION CONTAINING CERIUM OXIDE-COATED SILICON POWDER, PROCESS FOR THE PRODUCTION THEREOF AND USE THEREOF

CROSS REFERENCE TO RELATED CASES

The present application claims priority to German Application No. DE 102 04 471.6, filed on Feb. 5, 2002, which is hereby incorporated by reference in its entirety.

BACKGROUND OF THE INVENTION

1. Field of the Invention

The present invention relates to an aqueous dispersion containing a silicon dioxide powder coated with cerium oxide. In addition, the present invention provides a method of producing an aqueous dispersion containing a silicon dioxide powder coated with cerium oxide and methods of using this aqueous dispersion for chemical-mechanical polishing.

2. Discussion of the Background

Cerium oxide dispersions obtained by calcining a cerium compound and subsequently grinding the oxides have been used for a long time for glass polishing. These dispersions typically have particle sizes of more than 1000 nm and large impurity contents. These dispersions are suitable for a coarse polishing of surfaces, but not for polishing of sensitive optical surfaces, semiconductor substrates, or integrated circuits (i.e., chemical-mechanical polishing, CMP).

Smaller cerium oxide particles may be obtained from a process, which has been denoted hydrothermal synthesis. In this process a cerium (III) salt is oxidatively converted, under the influence of temperature and pressure, to cerium oxide, which crystallizes out in the form of fine particles. The particle sizes of the cerium oxide obtained by this process are 80–100 nm (EP-A-947 469), 7–50 nm (U.S. Pat. No. 5,389,352), or less than 30 nm and greater than 60 nm (U.S. Pat. No. 5,772,780). A disadvantage of this method is that it requires the use of very dilute cerium (III) solutions as the starting material.

U.S. Pat. No. 5,891,205 discloses mixtures of silicon dioxide and cerium oxide, which has been produced by hydrothermal synthesis. In the process disclosed in this reference, the cerium oxide must first by deagglomerated using a mill and subsequently the resultant cerium oxide dispersion is mixed with a silicon dioxide dispersions based on silica sol. The mixture can then be used for planarising silicon discs. The disadvantages associated with this process include the high complexity and costs for the production of the fine-particle dispersion. In addition, the deagglomeration of the cerium oxide by using a mill carries a risk of impurity transfer into the dispersion. Furthermore, it is readily appreciated in the art that silicon dioxide dispersion based on silica sol have a higher proportion of impurities than those based on silicon dioxide produced pyrogenically.

U.S. Pat. No. 5,382,272 discloses the activation of silicon dioxide particles by adsorption of a few percent by weight, preferably 2% by weight, of a cerium or zirconium oxide dispersion. The special feature of this process is that the activating effect is accomplished by grinding a silicon dioxide dispersion with a commercially available cerium or zirconium oxide dispersion. The resultant mixed dispersion behaves like pure cerium oxide dispersions in polishing of semi-conductor substrates with a high removal rate, but without leaving any scratches on the surface to be polished. This method has an advantage over other common methods in that the costs associated therewith are reduced and implementation is relatively simple. However, this method also harbors distinct disadvantages, which are described in detail in WO 00/17 282 A1, such as the production of a dispersion with a narrow particle size range and difficulties in achieving reproducible polishing results.

U.S. Pat. No. 5,697,992 discloses the production of a powder containing abrasive particles and aqueous dispersions produced therefrom. The abrasive particles consist of silicon dioxide or aluminum oxide and a coating of cerium oxide. In this reference, the abrasive particles have an average particle size of 2 $\mu$m or less. However, based on this disclosure, it is unclear whether the stated particle size refers to the powder or the dispersion. For silicon dioxide particles coated with cerium oxide a particle size of 0.6 $\mu$m is given in one example. The metal oxides come from either a sol-gel or a pyrogenic process. A disadvantage of the process employed in this reference is caking of the metal oxide particles, particularly those of pyrogenic origin, when being coated with a cerium compound. As such, this leads to the formation of hard aggregates that are difficult to disperse. In the dispersion, this can lead to a very broad particle size distribution and occasionally to the detachment of parts of the coating in the form of cerium oxide during dispersion. Accordingly, the dispersion obtained by the disclosure of U.S. Pat. No. 5,697,992 are non-uniform and, with the continuing miniaturization in the semi-conductor industry, accordingly are of only limited suitability for reproducible polishing of oxide surfaces.

Accordingly, there remains a critical need in the area of chemical-mechanical polishing (CMP) for extraordinarily high activity of cerium oxide compared to silicon dioxide and other dielectric oxides.

SUMMARY OF THE INVENTION

Accordingly, it is an object of the present invention to provide an aqueous dispersion containing cerium oxide, which is simple to produce, has only a small proportion of impurities and has a reproducibly adjustable particle size.

This object may be achieved by an aqueous dispersion containing a powder obtained from a core of doped, pyrogenically produced silicon dioxide with a low structure, by mixing, preferably spraying, with a cerium salt solution or suspension, forming a cerium oxide coating, wherein the powder does not exceed an average secondary particle size of 0.2 $\mu$m in the dispersion.

The above objects highlight certain aspects of the invention. Additional objects, aspects and embodiments of the invention are found in the following detailed description of the invention.

DETAILED DESCRIPTION OF THE INVENTION

Unless specifically defined, all technical and scientific terms used herein have the same meaning as commonly understood by a skilled artisan in the field of semi-conductors.

All methods and materials similar or equivalent to those described herein can be used in the practice or testing of the present invention, with suitable methods and materials being described herein. All publications, patent applications, patents, and other references mentioned herein are incorporated by reference in their entirety. In case of conflict, the present specification, including definitions, will control. Further, the materials, methods, and examples are illustrative only and are not intended to be limiting, unless otherwise specified.

The present invention is based in part on the Inventor's surprising discovery that an extraordinarily high activity cerium oxide possessing high removal rates and good selectivities, which are useful in chemical mechanical polishing can be achieved by employing an aqueous dispersion comprising a powder having an average secondary particle size of 0.2 µm obtained by a process comprising mixing a core consisting of doped, pyrogenically produced silicon dioxide having a low structure with a cerium salt solution or suspension to form a cerium oxide shell.

"Aqueous dispersion" as used herein means a dispersion in which the main component of the liquid phase is water.

"A core consisting of a doped, pyrogenically produced silicon dioxide" as used herein means a core in which the doping is introduced by means of an aerosol of a salt solution or suspension containing the doping component. For an example of the production of such cores the artisan is referred to DE-A-196 50 500.

"Low structure" as used herein means that the core consists of many individual spherical primary particles that are fused together only to a small extent. A measure of the low structure is the DBP absorption (dibutyl phthalate absorption). This is less than 100 g DBP/100 g powder, the term powder here referring to the doped core. It is also possible for the end point to be undetectable in the DBP absorption. In a pyrogenically produced, undoped silicon dioxide with the same BET surface area, in which the primary particles are more markedly fused together, the DBP absorption is generally more than 150 g DBP/100 g powder. For example, the commercially available, pyrogenically produced silicon dioxide OX 50, from Degussa AG, has a DBP absorption of 160 g DBP/100 g powder.

For the DBP absorption the force uptake or torque (in Nm) of the rotating blades of the DBP measuring instrument is measured upon addition of defined quantities of DBP, comparable to a titration. This method gives a sharply defined maximum for pyrogenic metal oxides (e.g. titanium dioxide or silicon dioxide) with a subsequent drop at a specific addition of DBP. For particles with a very low degree of fusing, it is also possible for the measuring instrument to be unable to detect an end point.

It is also possible to detect the low structure of the core by transmission electron micrographs.

Within the context of the present invention, cerium chloride, cerium nitrate, cerium acetate, cerium carbonate, cerium oxalate, cerium sulfate, ammonium cerium sulfate, or ammonium cerium nitrate may be used as the cerium salt solution or suspension.

As part of the present invention the coating may be applied by mixing, or preferably spraying, the aqueous and/or alcoholic slurry of the core with a cerium salt solution or suspension. The reaction mixture is subsequently dried and optionally calcined. Under the reaction conditions the cerium salt solution or suspension is converted to cerium oxide. The cerium oxide coating may be fully or partly formed.

The content of doping component in the core is between 10 ppm and 10 wt. %. The content of cerium oxide in the coated core is between 10 ppm and 65 wt. %.

The BET surface area of the powder is between 5 and 600 $m^2/g$.

The average secondary particle size in the dispersion according to the invention is less than 0.2 µm. The average secondary particle size may be determined by dynamic light scattering, or other well-recognized techniques.

Cores, the doping component of which is an alkali oxide or an aluminium oxide, can preferably be used.

The solids content of the dispersion according to the invention depends primarily on the intended use. For example, to save transport costs, a dispersion with the highest possible solids content is desirable. In contrast, for certain applications, such as for polishing, dispersions with low solids contents are used. Accordingly, a solids content of 0.1 to 70 wt. % is preferred within the present invention, and the range between 1 and 30 wt. % is particularly preferred.

Within the purview of the present invention, the dispersion may also contain additives selected from the group consisting of pH-regulating substances (such as acids, bases and/or buffer systems), oxidizing agents, oxidation activators, corrosion inhibitors, abrasives, and/or surface-active substance.

The pH of the dispersion according to the present invention may be between 3 and 11.

A pH increase may be affected by the addition of alkali hydroxides or amines. Ammonium hydroxide, potassium hydroxide and tetramethylammonium hydroxide are particularly preferred.

By adding acids, the pH can be shifted into the acid range, i.e. to a pH of 3. Carboxylic acids of the general formula $C_nH_{2n+1}CO_2H$, with n=0–6 or n=8, 10, 12, 14, 16, or dicarboxylic acids of the general formula $HO_2C(CH_2)_n CO_2H$, with n=0–4, or hydroxycarboxylic acids of the general formula $R_1R_2C(OH)CO_2H$, with $R_1$=H, $R_2$=$CH_3$, $CH_2CO_2H$, $CH(OH)CO_2H$ or glycolic acid, pyruvic acid, salicylic acid or mixtures of the above acids are preferably used for this purpose. Acetic acid, citric acid and salicylic acid are particularly preferred for this purpose.

The present invention also provides a process for the production of the dispersion described herein, where the powder is first pre-dispersed in an aqueous medium, optionally with the addition of additives, and the pre-dispersion is then dispersed, wherein the average secondary particle size in the dispersion is less than 0.2 µm.

"Pre-dispersion" as used herein means a dispersion with an average particle size of no more than 1 mm. High-speed mixers or toothed discs, for example, are suitable for pre-dispersing.

Rotor-stator machines, such as Ultra Turrax (IKA) or those from Ystral, are suitable for dispersing, as are ball mills and attrition mills.

Higher energy inputs are possible with a planetary kneader/mixer. However, the effectiveness of this system is linked to a sufficiently high viscosity of the mixture being worked to introduce the high shear energies required to break down the particles.

A high-pressure homogenizer can preferably be used to produce the dispersion according to the invention.

With high-pressure homogenizers, particularly fine-particle dispersions can be produced. In these devices, two pre-dispersed suspension streams under high pressure are depressurised using a nozzle. The two dispersion jets collide with each other exactly and the particles grind one another.

In another embodiment, the pre-dispersion is also placed under high pressure, but the particles collide with armored wall areas. The operation can be repeated as often as desired to obtain smaller particle sizes.

The invention also provides the use of the dispersion according to the present invention for the chemical-mechanical polishing of semi-conductor substrates or of layers applied thereon. In particular, the present invention provides a use of the dispersion for polishing of oxide and metallic layers, and in the shallow trench isolation process (STI process). In this process, after applying a silicon nitride layer, isolation structures are etched into the silicon layer of a wafer, the resulting grooves are then filled with silicon dioxide and excess silicon dioxide is removed by chemical-mechanical polishing.

It has thus been found that the powder obtained from doped, pyrogenically produced silicon dioxide particles with a low structure and a cerium salt solution or suspension can be reproducibly dispersed to secondary particle sizes of no more than 0.2 μm in an aqueous medium without any cerium oxide being detached and without any coarse particles forming. Such a result is surprising, as for example a dispersion obtained in accordance with U.S. Pat. No. 5,697,992 containing undoped silicon dioxide as the core cannot be reproducibly dispersed and cerium oxide becomes detached.

Having generally described this invention, a further understanding can be obtained by reference to certain specific examples, which are provided herein for purposes of illustration only, and are not intended to be limiting unless otherwise specified.

EXAMPLES

Analytical Method

The average secondary particle size was determined with the Zetasizer 3000 Has from Malvern.

The BET surface area was determined in accordance with DIN 66131. The loss on drying (LOD) was determined on the basis of DIN/ISO 787/II, ASTM D 280, and JIS K 5101/21 over a period of 2 hours at 105° C. The loss on ignition (LOI) was determined on the basis of DIN 55921, ASTM D 1208, and JIS K 5101/23, in relation to the substance dried for 2 hours at 105° C., over a period of 2 hours at 1000° C.

The viscosity of the dispersions was determined with a rotary rheometer from Physica, model MCR 300 and the CC 27 measuring cup. The viscosity value was determined at a shear rate of 100 sec$^{-1}$. This shear rate lies within a range in which the viscosity is practically independent of the shear stress.

The evaluation of a sediment formation takes place by visual evaluation in a 1000-ml wide-neck polyethylene flask after a residence time of one week. By carefully tipping the flask, any sediment present could be readily seen.

Powder

Powder 1 (P1): Silicon Dioxide Powder Coated with Cerium Oxide and Doped with Aluminum Oxide 15 kg of silicon dioxide powder doped with 0.25 wt. % $Al_2O_3$ (DBP value: 80 g/100 g), obtained in accordance with the process of DE-A-198 47 161, were sprayed with a solution of 5 kg of cerium nitrate [$(Ce(NO_3)_3 \times 6H_2O)$] in 3 l of water. The water was left to dry at 90° C. A heat treatment then takes place for 3 hours at 500° C.

Powder 2 (P2): Silicon Dioxide Coated with Cerium Oxide and Doped with Potassium Oxide 15 kg of silicon dioxide powder doped with 0.2 wt. % potassium oxide (DBP value impossible to determine), obtained in accordance with the process of DE-A-196 50 500, were sprayed with a solution of 5 kg of cerium nitrate [$(Ce(NO_3)_3 \times 6H_2O)$] in 3 l of water. The water was left to dry at 90° C., followed by heat treatment for 3 hours at 500° C.

Powder 3 (P3): Aerosil 90

Commercially available AEROSIL® 90, a fumed silica with a BET surface area of approximately 90 m$^2$/g, obtained from Degussa.

The analytical data of powders P1, P2, and P3 are presented in Table 1.

TABLE 1

Analytical data of powders P1, P2, and P3.

| | $SiO_2$ wt. % | $CeO_2$ wt. % | BET m$^2$/g | LOD wt. % | LOI wt. % |
|---|---|---|---|---|---|
| P1 | 91.50 | 8.25 | 61 | 1.9 | 0.8 |
| P2 | 92.70 | 9.10 | 121 | 2.4 | 0.3 |
| P3 | >99.9 | — | 90 | 0.9 | 0.8 |

Dispersions

Method A 18.0 kg of deionized water and 80 g of 30% KOH solution were initially charged into a 60 l stainless steel batch vessel. With the aid of a dispersing and vacuum mixer from Ystral (at 4500 rpm), 6.25 kg of one of the powders P1 to P3 were sucked in and coarsely pre-dispersed. After introducing the powder, dispersing was completed with a rotor/stator continuous homogenizer type Z 66 from Ystral with four processing rings, a stator slot width of 1 mm, and a speed of 11,500 rpm. During the 15-minute dispersion at 11,500 rpm the pH was adjusted to and held at a value of 10.5 by the addition of a KOH solution. A further 150 g of KOH solution were used for this and, by adding 0.5 kg of water, an abrasive substance concentration of 25 wt. % was established. After removing 12.5 kg of dispersion for method B, 12.5 kg of deionized water from the batch vessel were added and the dispersion, which was now 12.5 wt. %, was homogenized for 5 minutes with the continuous homogenizer at a speed of 11,500 rpm.

According to this method each dispersion denoted as D1-A, D2-A, and D3-A were obtained.

Method B

Approximately half the dispersion according to method A was ground using a high-pressure homogenizer, Ultimaizer System from Sugino Machine Ltd., model HJP-25050, under a pressure of 250 Mpa and with a diamond nozzle diameter of 0.3 mm and two grinding passes.

After grinding, 12.5 kg of deionized water and 12.5 kg of the ground dispersion were placed into a 60 l stainless steel batch vessel and the dispersion, which, was now 12.5 wt. %, was homogenized for 5 minutes with the continuous homogenizer type Z 66 from Ystral at a speed of 11,500 rpm.

According to this method each dispersion denoted as D1-B, D2-B, and D3-B were obtained.

The analytical data for the dispersion are listed in Table 2.

TABLE 2

Analytical data of the dispersions[1]

| Dispersion | Average particle diameter | | Viscosity [mPas] | Sediment |
| | Number [nm] | Volume [nm] | | |
|---|---|---|---|---|
| D1-A | 122 | 301 | 3 | Yes |
| D1-B | 80 | 195 | 2 | No |
| D2-A | 119 | 249 | 8 | Yes |
| D2-B | 71 | 147 | 4 | No |
| D3-A | 197 | 271 | 7 | Yes |
| D3-B | 150 | 163 | 3 | No |

[1]Solids content 30 wt. %, pH 10.5.

Stable dispersions, which did not form any sediment, could only be obtained by dispersing method B. The average particle diameters of the dispersions obtained by method B were much smaller than those obtained by method A. The dispersions D1-B and D2-B, containing silicon dioxide particles coated with cerium oxide, displayed average particle diameters, in terms of number and volume, of less than 200 nm.

| Polishing process | |
|---|---|
| Equipment: | Presi Polisher Type 460 M, equipped with a 550 mm polishing table with a perforated Rodel IC 1400 polishing pad. |
| Wafer: | 4" silicon discs coated with 500 nm $SiO_2$ (thermally produced), 4" silicone discs coated with 500 nm $Si_3N_4$ (LPCVD). |

The removal rate (RR) was evaluated by measuring the coat thickness with the Prometrix FDT 650 instrument (KLA-Tencor Corporation) and by weighing the wafer with a Satorius BP 210D balance. For the average RR, 10 wafers were each polished and evaluated.

Coarse scratches and defects were evaluated with a device from Tencor, Surfscan 5000 model.

The polishing parameters are given in Table 3.

TABLE 3

| Polishing parameters | |
|---|---|
| Polishing time/polishing pressure | 15 s/0.2 bar, 60 s/0.8 bar, 15 s/0.2 bar rinse |
| Rotational speed | 60 rpm |
| Rate of adding dispersion | 100 ml/min |
| Temperature | Approximately 25° C. |
| Conditioning | Before each polishing test with a diamond grinding spindle disc at 1 bar, time 10 s |
| Post CMP Cleaning | Ultrasound cleaning (Techsonic) and a brush cleaner SVG 8620 single side cleaner/dryer. |

The values for the removal rates and the selectivities of the dispersions are compiled in Table 4.

TABLE 4

Average removal rate (RR) and selectivities $SiO2/Si_3N_4$

| | RR thermal $SiO_2$ | | RR $Si_3N_4$ | | Selectivity | | |
|---|---|---|---|---|---|---|---|
| | Weighing | Prometrix | Weighing | Prometrix | RR $SiO_2$/RR $Si_3N_4$ | | Scratches/ |
| Dispersion | [nm/min] | [nm/min] | [nm/min] | [nm/min] | Weighing | Prometrix | defects |
| D1-A | 1821 | 1753 | 314 | 301 | 5.8 | 5.8 | Few |
| D1-B | 1790 | 1693 | 307 | 293 | 5.8 | 5.8 | None |
| D2-A | 1774 | 1695 | 311 | 297 | 5.7 | 5.7 | Few |
| D2-B | 1723 | 1650 | 303 | 290 | 5.7 | 5.7 | None |
| D3-A | 1078 | 1005 | 325 | 303 | 3.3 | 3.4 | Several |
| D3-B | 1023 | 956 | 321 | 313 | 3.3 | 3.3 | none |

As evidenced by the results in Table 4, it is apparent that, when using dispersions D1-B and D2-B according to the present invention high removal rates, good selectivities, and no detectable scratches when polishing silicon dioxide surfaces are obtained. Dispersion D1-A and D2-A also display high removal rates and good selectivities; however, scratches and defects can be detected, which limit their use as a polishing suspension. Overall, all the doped silicon dioxide dispersions coated with cerium oxide that were investigated display better values for removal rate, selectivity, and number of defects than a dispersion based on pure silicon dioxide (D3-A, D3-B).

Numerous modifications and variations on the present invention are possible in light of the above teachings. It is, therefore, to be understood that within the scope of the accompanying claims, the invention may be practiced otherwise than as specifically described herein.

What we claim is:

1. An aqueous dispersion comprising a powder having an average secondary particle size of 0.2 μm obtained by a process comprising mixing a core consisting of doped, pyrogenically produced silicon dioxide having a low structure with a cerium salt solution or suspension to form a cerium oxide shell on said core.

2. The aqueous dispersion according to claim 1, wherein said mixing is by spraying said cerium salt solution or suspension on said core.

3. The aqueous dispersion according to claim 1, wherein the dopant is alkali oxide or aluminum oxide.

4. The aqueous dispersion according to claim 1, wherein the content of the doping component in the core is between 10 ppm and 10 wt. %.

5. The aqueous dispersion according to claim 1, wherein the content of cerium oxide in the coated core is between 10 ppm and 65 wt. %.

6. The aqueous dispersion according to claim 1, wherein the content of solids in the dispersion is between 0.1 and 70 wt. %.

7. The aqueous dispersion according to claim 1, wherein the content of solids in the dispersion is between 1 and 30 wt. %.

8. The aqueous dispersion according to claim 1, wherein the pH of the dispersion is between 3 and 11.

9. The aqueous dispersion according to claim 1, wherein the cerium salt solution or suspension is selected from the group consisting of cerium chloride, cerium nitrate, cerium acetate, cerium carbonate, cerium oxalate, cerium sulfate, ammonium cerium sulfate, and ammonium cerium nitrate.

10. The aqueous dispersion according to claim 1, further comprising one or more additives selected from the group consisting of a pH-regulating substance, an oxidizing agent, an oxidation activator, a corrosion inhibitor, an abrasive, and a surface-active substance.

11. The aqueous dispersion according to claim 1, further comprising one or more pH-regulating substances selected from the group consisting of an acid, a base, and a buffer system.

12. The aqueous dispersion according to claim 1, further comprising one or more pH-regulating substances selected from the group consisting of ammonium hydroxide, potassium hydroxide, tetramethylammonium hydroxide, a carboxylic acids of the general formula $C_nH_{2n+1}CO_2H$, with n=0–6 or n=8, 10, 12, 14, 16, dicarboxylic acids of the general formula $HO_2C(CH_2)_nCO_2H$, with n=0–4, hydroxycarboxylic acids of the general formula $R_1R_2C(OH)CO_2H$, with $R_1$=H, $R_2$=$CH_3$, $CH_2CO_2H$, $CH(OH)CO_2H$, glycolic acid, pyruvic acid, and salicylic acid.

13. A process for the production of an aqueous dispersion according to claim 1, comprising pre-dispersing powder containing a mixture of a core consisting of doped, pyrogenically produced silicon dioxide having a low structure and a cerium salt solution or suspension in an aqueous medium, and dispersing the pre-dispersion to obtain an average secondary particle size of 0.2 µm.

14. The process according to claim 13, further comprising adding to the aqueous dispersion one or more additives selected from the group consisting of a pH-regulating substance, an oxidizing agent, an oxidation activator, a corrosion inhibitor, an abrasive, and a surface-active substance.

15. The process according to claim 13, further comprising adjusting the pH of the aqueous dispersion to a pH between 3 and 11.

16. The process according to claim 15, further comprising adding to the aqueous dispersion one or more pH-regulating substances selected from the group consisting of an acid, a base, and a buffer system.

17. The process according to claim 15, further comprising adding to the aqueous dispersion one or more pH-regulating substances selected from the group consisting of ammonium hydroxide, potassium hydroxide, tetramethylammonium hydroxide, a carboxylic acids of the general formula $C_nH_{2n+1}CO_2H$, with n=0–6 or n=8, 10, 12, 14, 16, dicarboxylic acids of the general formula $HO_2C(CH_2)_nCO_2H$, with n=0–4, hydroxycarboxylic acids of the general formula $R_1R_2C(OH)CO_2H$, with $R_1$=H, $R_2$=$CH_3$, $CH_2CO_2H$, $CH(OH)CO_2H$, glycolic acid, pyruvic acid, and salicylic acid.

18. A method comprising, chemical-mechanical polishing a one or more substrates selected from the group consisting of a semi-conductor substrate, a layer applied to a semi-conductor substrates, and a substrate obtained by a shallow trench isolation process, with a aqueous dispersion according to claim 1.

* * * * *